(12) United States Patent
Kasperkovitz

(10) Patent No.: US 7,242,730 B2
(45) Date of Patent: Jul. 10, 2007

(54) MIRROR SUPPRESSION CIRCUIT AND RECEIVER USING SUCH CIRCUIT

(75) Inventor: Wolfdietrich Georg Kasperkovitz, Waalre (NL)

(73) Assignee: SemiConductor Ideas to Market, B.V., Breda (NL)

( * ) Notice: Subject to any disclaimer, the term of this patent is extended or adjusted under 35 U.S.C. 154(b) by 362 days.

(21) Appl. No.: 10/509,210

(22) PCT Filed: May 1, 2003

(86) PCT No.: PCT/EP03/04848

§ 371 (c)(1),
(2), (4) Date: Sep. 24, 2004

(87) PCT Pub. No.: WO03/096524

PCT Pub. Date: Nov. 20, 2003

(65) Prior Publication Data

US 2005/0226352 A1    Oct. 13, 2005

(30) Foreign Application Priority Data

May 7, 2002    (EP)    ................................ 02076835

(51) Int. Cl.
*H03D 1/04*    (2006.01)
(52) U.S. Cl. .................................................... 375/346
(58) Field of Classification Search ................. 375/346
See application file for complete search history.

(56) References Cited

U.S. PATENT DOCUMENTS

| | | | | |
|---|---|---|---|---|
| 4,776,040 A | * | 10/1988 | Ichikawa et al. | ............ 455/315 |
| 4,926,443 A | * | 5/1990 | Reich | ............ 375/349 |
| 5,034,965 A | * | 7/1991 | Kato | ............ 375/243 |
| 5,157,346 A | * | 10/1992 | Powell et al. | ............ 330/151 |
| 5,220,686 A | * | 6/1993 | Kasperkovitz et al. | ... 455/234.1 |
| 5,461,426 A | * | 10/1995 | Limberg et al. | ............ 348/475 |
| 5,483,681 A | * | 1/1996 | Bergsten et al. | ............ 455/126 |
| 5,551,070 A | * | 8/1996 | Skarby et al. | ............ 455/126 |
| 5,826,180 A | * | 10/1998 | Golan | ............ 455/302 |
| 6,130,918 A | * | 10/2000 | Humphrey et al. | ............ 375/295 |
| 6,144,708 A | * | 11/2000 | Maruyama | ............ 375/327 |
| 6,408,008 B1 | * | 6/2002 | Komarek et al. | ............ 370/458 |
| 6,671,340 B1 | * | 12/2003 | Kroeger et al. | ............ 375/350 |
| 6,714,776 B1 | * | 3/2004 | Birleson | ............ 455/302 |

(Continued)

FOREIGN PATENT DOCUMENTS

EP    0343273    9/1989

(Continued)

*Primary Examiner*—David C. Payne
*Assistant Examiner*—Leon-Viet Nguyen
(74) *Attorney, Agent, or Firm*—Robert M. McDermott, Esq.

(57) ABSTRACT

A mirror suppression circuit includes a first quadrature signal path coupled between quadrature signal input and output terminals and an error correction circuit for correction of amplitude and phase errors in a carrier modulated quadrature signal. To obtain a suppression of both amplitude and phase imbalance of the carrier modulated quadrature signal as well as signal amplitude variations, a quadrature output of the error correction circuit is coupled to an error detection circuit. The error detection circuit detects amplitude and phase errors and provides amplitude and phase control signals to the error correction circuit for a negative feed back of the amplitude and phase errors. The amplitude and phase control signals vary with products of components of the quadrature signal and components of a quadrature reference signal.

20 Claims, 3 Drawing Sheets

U.S. PATENT DOCUMENTS

| | | | |
|---|---|---|---|
| 6,952,462 B2 * | 10/2005 | Harrison | 375/373 |
| 7,054,378 B2 * | 5/2006 | Walton et al. | 375/267 |
| 2002/0142725 A1 * | 10/2002 | Clelland et al. | 455/63 |
| 2002/0158622 A1 * | 10/2002 | Rayne et al. | 324/76.53 |
| 2003/0071925 A1 * | 4/2003 | Kanno et al. | 348/726 |
| 2003/0076900 A1 * | 4/2003 | Magee et al. | 375/316 |
| 2003/0081705 A1 * | 5/2003 | Miller | 375/346 |
| 2004/0196923 A1 * | 10/2004 | Feher | 375/299 |
| 2005/0032485 A1 * | 2/2005 | Bachman et al. | 455/114.2 |

FOREIGN PATENT DOCUMENTS

| | | |
|---|---|---|
| EP | 1164692 | 6/2001 |
| EP | 1168597 | 6/2001 |
| GB | 2345230 | 6/2000 |
| WO | WO 99/23756 * | 5/1999 |
| WO | WO 01/58029 A1 * | 8/2001 |

* cited by examiner

MIRROR SUPPRESSION CIRCUIT AND RECEIVER USING SUCH CIRCUIT

The invention relates to a mirror suppression circuit comprising a first quadrature signal path coupled between quadrature signal input and output terminals and including an error correction circuit for correction of amplitude and phase errors in a carrier modulated quadrature signal comprising a pair of in-phase and phase quadrature signal components as well as to a receiver providing quadrature signal processing, comprising an RF input stage subsequently followed by a mixer stage and an IF stage for a selective amplification and level stabilisation of said IF signal and using such mirror suppression circuit.

A receiver of this type is on itself known from e.g. published patent application WO 01/58029. In this known receiver, the RF input stage provides broadband selection and automatic gain controlled amplification of a received RF frequency range, a wanted RF input signal within said received RF frequency range being converted in said mixer stage into a predetermined fixed IF, using a tuning oscillator generating a tuning oscillator signal at a frequency fosc differing from the carrier frequency of the wanted RF input signal by said fixed IF. Quadrature phase splitting may be obtained by the use of resonance amplifier type polyphase filters such as known from e.g. U.S. Pat. No. 5,220,686 being hereby incorporated by reference, in the RF or IF signal path or alternatively by the use of quadrature mixers in the mixer stage.

Figure 1A:
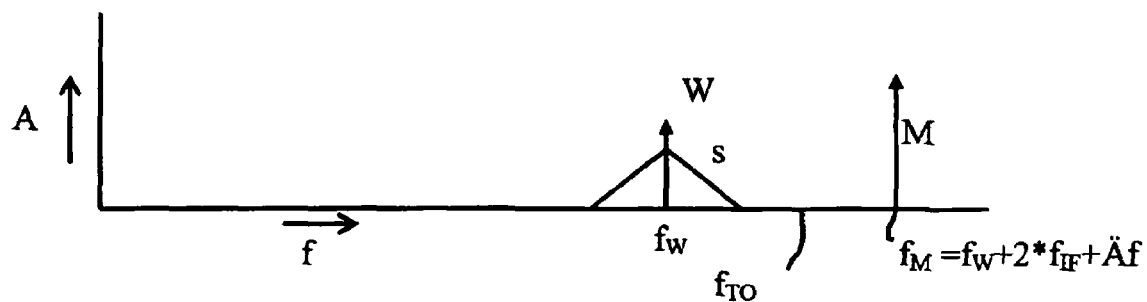

As known, the frequency distribution of the RF transmission signals throughout the received RF frequency range gives rise to frequency dispositions, in which a wanted RF signal finds an unwanted RF signal located at or close to a mirror frequency, i.e. an RF carrier frequency which in the receiver folds back in or close to the baseband modulation frequency range of the wanted RF signal. Such frequency disposition is depicted in the diagram of FIG. 1A, in which a wanted RF signal W carrying a baseband modulation signal s is located around a carrier frequency $f_W$, and the unwanted signal—hereinafter being referred to as mirror signal M—at a carrier frequency $f_M = f_W + 2^*f_{IF} + \Delta f$, in which $f_{IF}$ is the IF receiver frequency equalizing $f_{TO} - f_W$, with $f_{TO}$ being the frequency of the tuning oscillator, and $\Delta f$ as depicted being smaller than the frequency range of the baseband modulation signal s.

Figure 1B:
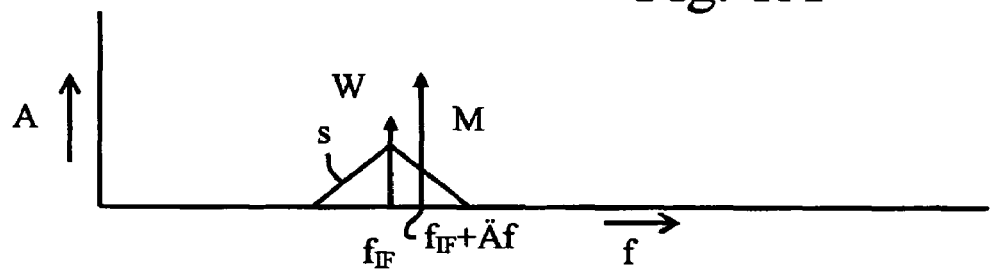

In FIG. 1B the frequency disposition of the wanted and mirror signals W and M is depicted in the IF range after RF/IF conversion in the tuning stage. The RF/IF conversion not only provides down conversion of the wanted RF signal W to a positive frequency $f_{IF}$, but also folds the carrier frequency of the unwanted mirror signal M around the tuning oscillator frequency $f_{TO}$ to a negative frequency $f_{IF} + \Delta f$, hereinafter also being referred to as unwanted IF mirror signal M, occurring within the frequency range of the useful baseband signal s of the wanted IF signal W.

In a perfect quadrature signal processing receiver the wanted IF signal W can be selectively amplified, while supressing the unwanted IF mirror signal M without any conversion thereof into the positive frequency domain. In practise, however, imperfections in the quadrature signal processing cannot be prevented due to tolerance spread, parasitic phenomena and/or element mismatch, causing the unwanted IF mirror signal M to fold back into the positive frequency domain. Once this happened, the mirror signal M will intermingle inseparably with the wanted quadrature signal W and will be further processed accordingly. As a result thereof, mirror signals may dominate the AGC control of the IF stage, therewith preventing the wanted IF signal W from obtaining the appropriate IF set level for further signal processing. This in particular holds for wanted IF quadrature signals W being accompanied with relatively strong unwanted IF mirror signals.

The known FM receiver comprises a mirror suppression circuit restoring the mutual amplitude and phase orthogonal balance of the quadrature signal components of the IF signal at the output of the IF stage. This known error correction, however, is restricted to signals with constant amplitude, such as FM signals or other angle modulated signals, and is even within this restriction, not effective to the abovementioned intermingling of the wanted quadrature signal with incoming mirror or image signals caused by the I/Q signal processing of the quadrature signal components occurring in the preceding circuitry, in particular in the polyphase IF filter. Furthermore, strong mirror signals cannot be prevented from dominating receiver control functions, such as the Automatic Gain Control (AGC), or may even overload active receiver circuits causing non-linearities to occur. This in particular makes it difficult to use the abovementioned resonance amplifier type polyphase filters for the selection of the IF signal.

Apart therefrom, in more general sense, the above inevitable imperfections in the processing of quadrature signals result in amplitude and phase errors, which on themselves give rise to intrinsic mirror of image interferences occurring at or close to the negative carrier frequency of said wanted quadrature signal, without any external supply of mirror signals such as in receiver applications.

Now, therefore, it is a first object of the invention to provide a low cost and more effective mirror suppression or image rejection circuit, which can be generally applied to correct amplitude and phase errors in a quadrature signal.

It is a second object of the invention to provide a mirror suppression circuit, which can be applied in any type of receiver and is not restricted to the use thereof in FM receivers and which prevents strong mirror signals from driving active circuits beyond their linear input range.

This object is achieved in a mirror suppression circuit as described in the opening paragraph according to the invention, which is characterized by a quadrature output of said error correction circuit being coupled through a first filter circuit for a selection of said quadrature signal to a first quadrature input of an error detection circuit, said first quadrature signal path being coupled prior to said first filter circuit through a second quadrature signal path to a second quadrature input of said error detection circuit, said error detection circuit detecting amplitude and phase errors and providing amplitude and phase control signals to amplitude and phase control inputs of said error correction circuit for a negative feed back of said amplitude and phase errors to said error correction circuit, said amplitude control signal varying with at least one of products $I_w {}^* I_{ref}$ and $Q_w {}^* Q_{ref}$ and said phase control signal varying with at least one of products $I_w {}^* Q_{ref}$ and $Q_w {}^* I_{ref}$, $I_w$ and $Q_w$, respectively $I_{ref}$ and $Q_{ref}$, representing the in-phase and phase quadrature signal components of said quadrature signal at the first quadrature input of the error detection circuit, respectively the in-phase and phase quadrature signal components of a quadrature reference signal occurring at the negative carrier frequency of said quadrature signal at the second quadrature input of the error detection circuit.

By applying this measure according to the invention, the error detection circuit receives at its first quadrature input the selected wanted quadrature signal from the first filter circuit and at its second quadrature input the unwanted quadrature mirror signal from the second quadrature signal path. In contrast to the error detection circuit of the known FM receiver receiving amplitude limited oscillator signals at its first and second quadrature input, both selected wanted quadrature signal and unwanted quadrature mirror signal are not amplitude limited. The error detection circuit derives therefrom amplitude and phase control signals, which apart from the amplitude and phase imbalance between the in-phase and phase quadrature signal components of the wanted signal also vary with amplitude variations of said both selected wanted quadrature signal and unwanted quadrature mirror. The mirror suppression circuit is therewith transparent for both angle as well as amplitude modulated signals, allowing use thereof in all type of receivers, including FM and AM receivers.

According to the invention these amplitude and phase control signals are coupled to the error correction circuit for a negative feedback of the amplitude and phase errors as well as the amplitude variations of both selected wanted quadrature signal and unwanted quadrature mirror signal. As a result thereof, the quadrature signal at the output of said error correction circuit is pre-corrected for amplitude and phase errors introduced subsequently in the first filter circuit, whereas both wanted quadrature signal and unwanted quadrature mirror signal are being stabilised against variations. Compared with said prior art, the measure according to the invention not only result in a considerably improved image frequency suppression, but also prevents the first filter circuit from being overloaded.

According to an aspect of the invention, a receiver providing quadrature signal processing and comprising an RF input stage subsequently followed by a mixer stage for a conversion of an RF signal into an IF signal and an IF stage for a selective amplification of said IF signal, is characterized by a mirror suppression circuit having its quadrature signal input coupled to a quadrature output of the mixer stage and said first filter circuit being part of said IF stage and having a resonance frequency at the carrier frequency of said IF signal.

By applying this measure according to the invention, the IF stage of the receiver is used not only for selective IF signal amplification, but is also part of the mirror suppression circuit and is prevented from being overloaded at the reception of strong mirror signals.

To optimize the detection of amplitude and phase errors, said amplitude control signal preferably varies with $I_w*I_{ref}+Q_w*Q_{ref}$ and said phase control signal with $I_w*Q_{ref}-Q_w*I_{ref}$.

To obtain said quadrature reference signal, the second quadrature signal path preferably includes inverter means.

In another preferred embodiment of the invention, said second quadrature signal path includes a second filter circuit for a selection of said quadrature reference signal and/or may be coupled to the first quadrature signal path subsequent to the error correction circuit.

A further preferred embodiment of the invention is characterized by said second quadrature signal path comprising said signal inverter coupled between the first quadrature signal path and said second filter circuit, said second filter circuit being identical to said first filter circuit.

Figure 2:
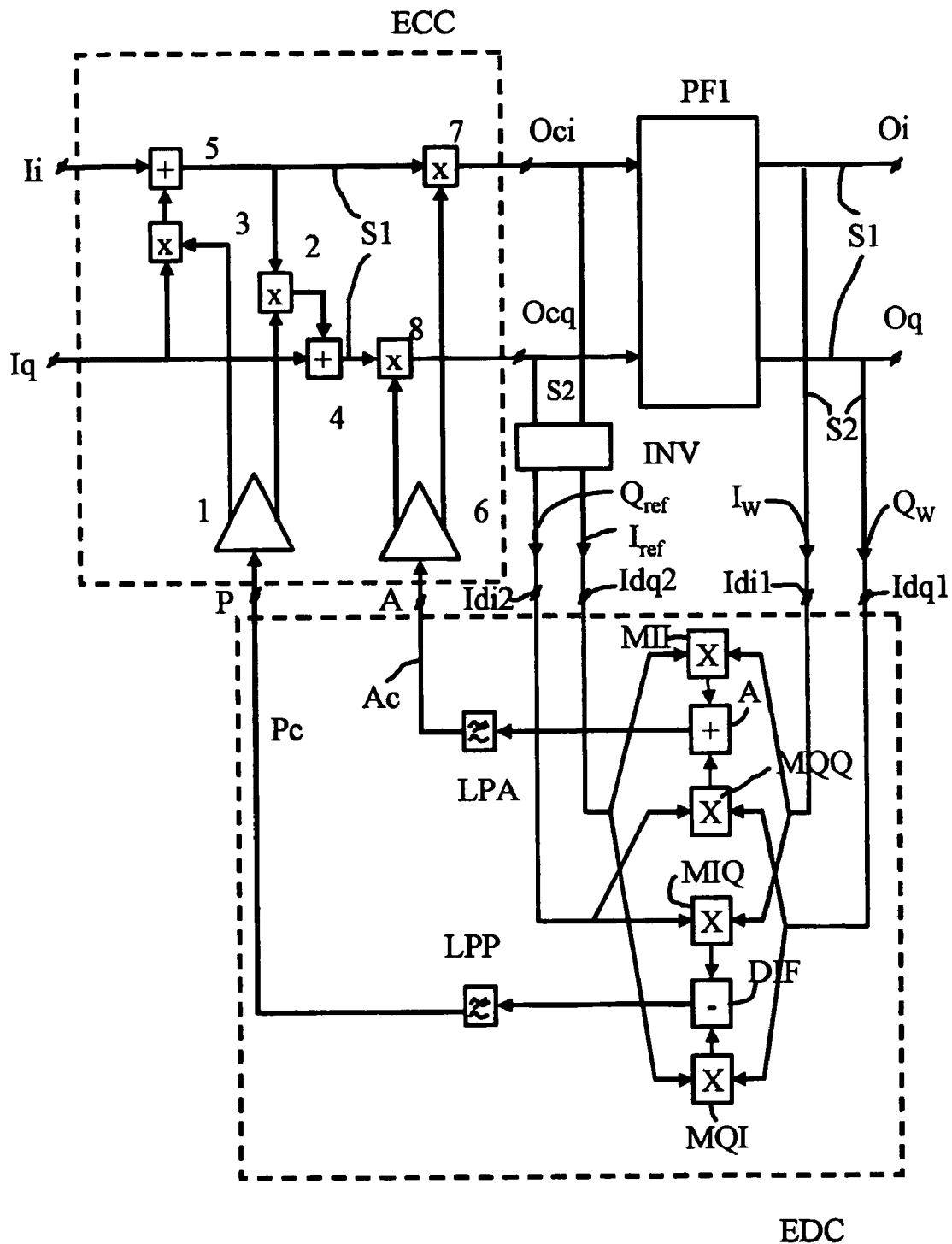
Figure 3:
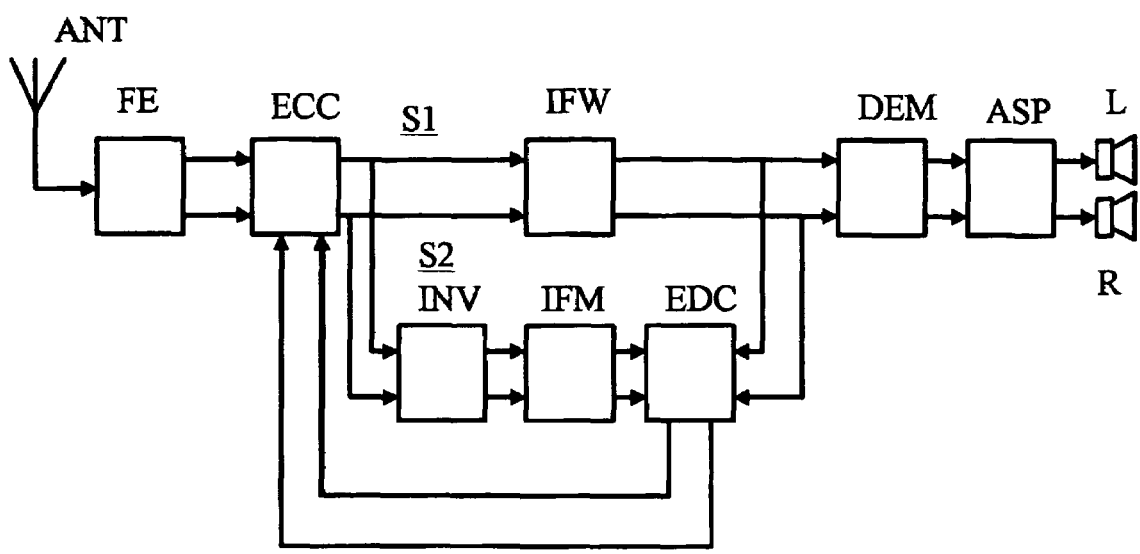

The invention will now be explained in more detail with reference to the accompanying drawing, in which:

FIGS. 1A and 1B are amplitude (A)-frequency ($\omega$) diagrams representing a wanted carrier modulated quadrature signal and its mirror signal;

FIG. 2 an embodiment of a mirror suppression circuit according to the invention;

FIG. 3 an embodiment of a receiver comprising a mirror suppression circuit according to the invention.

FIG. 2 shows an embodiment of a mirror suppression circuit according to the invention comprising a first quadrature signal path S1 coupled between quadrature signal input and output terminals Ii, Iq and Oi, Oq including an error correction circuit ECC for correction of amplitude and phase errors in a carrier modulated quadrature signal comprising a pair of in-phase and phase quadrature signal components. A quadrature output Oci, Ocq of said error correction circuit ECC is coupled through a first filter circuit PF1 having a resonance frequency at the carrier frequency of said quadrature signal to a first quadrature input Idi1, Idq1 of an error detection circuit EDC, said first quadrature signal path S1 being coupled prior to said filter circuit PF through a second quadrature signal path S2 to a second quadrature input Idi2, Idq2 of said error detection circuit EDC through an inverter INV for an inversion of the in-phase and phase quadrature signal components of the above carrier modulated quadrature signal. This error detection circuit EDC detects amplitude and phase errors $\delta A$ and $\delta \Phi$, respectively, and provides amplitude and phase control signals Ac and Pc to amplitude and phase control inputs A and P of said error correction circuit ECC for a negative feed back of said amplitude and phase errors $\delta A$ and $\delta \Phi$ to said error correction circuit ECC, said amplitude control signal Ac varying with at least one of products $I_w*I_{ref}$ and $Q_w*Q_{ref}$ and said phase control signal varying with at least one of products $I_w*Q_{ref}$ and $Q_w*I_{ref}$, in which $I_w$ and $Q_w$ respectively represent the in-phase and phase quadrature signal components of the quadrature signal at the first quadrature input Idi1, Idq1 of the error detection circuit EDC, and in which $I_{ref}$ and $Q_{ref}$ respectively represent the in-phase and phase quadrature signal components of a quadrature reference signal occurring at the negative carrier frequency of said quadrature signal supplied to the second quadrature input Idi2, Idq2 of the error detection circuit EDC. Although the invention can in principle be applied with the amplitude control signal Ac varying with either product $I_w*I_{ref}$ or $Q_w*Q_{ref}$ and said phase control signal varying with either product $I_w*Q_{ref}$ or $Q_w*I_{ref}$, the amplitude control signal Ac is to vary by preference with $I_w*I_{ref}+Q_w*Q_{ref}$ and said phase control signal Pc with $I_w*Q_{ref}-Q_w*I_{ref}$.

To obtain these amplitude and phase control signal Ac and Pc, the error detection circuit EDC comprises multiplier stages MII, MQQ, MIQ and MQI, having first input terminals being coupled respectively to the output terminals Oi, Oq, Oi and Oq, and second input terminals being coupled respectively to the output terminals Oci, Ocq, Oci and Ocq of the quadrature output of the error correction circuit ECC to provide said products $I_w*I_{ref}$, $Q_w*Q_{ref}$, $I_w*Q_{ref}$ and $Q_w*I_{ref}$, respectively. Outputs of multiplier stages MIE and MQQ are being coupled to an adder circuit ADD and outputs of multiplier stages MIQ and MQI are being coupled to an difference circuit DIF, to form respectively the sum of $I_w*I_{ref}$ and $Q_w*Q_{ref}$, and the difference of $I_w*Q_{ref}$ and $Q_w*I_{ref}$. Outputs of the adder circuit ADD and the difference circuit DIF are being coupled through low pass filters LPA and LPP to the amplitude and phase control inputs A and P of the error correction circuit ECC to supply thereto the above amplitude control signal Ac varying with $I_w*I_{ref}+Q_w*Q_{ref}$ and said phase control signal Pc varying with $I_w*Q_{ref}-Q_w*I_{ref}$.

In an alternative embodiment of the invention (not shown), the inverter INV is dispensed with by providing an appropriate signal inversion within the multiplier stages MII, MQQ, MIQ and MQI.

The error correction circuit ECC comprises a phase correction circuit 1-5 including a differential stage 1 following the phase control input P converting said phase error signal δΦ into a differential pair of first and second phase error signals +0.5 δΦ and −0.5 δΦ and supplying the same to modulation signal inputs of first and second multipliers 2 and 3, respectively, said first and second multipliers 2 and 3 having inputs coupled to the in-phase and phase quadrature paths I and Q of the first quadrature signal path S1 and having outputs coupled through first and second adder device 4 and 5 to the phase quadrature and in-phase paths Q and I, respectively, therewith pre-correcting the in-phase and phase quadrature signals of the first quadrature signal path S1 with −δΩ to pre-compensate for the phase error δΩ occurring in the first filter circuit PF1. The error correction circuit ECC also comprises an amplitude correction circuit 6-8 including a differential stage 6 following the amplitude control input A converting said amplitude error signal δA into a differential pair of first and second amplitude error signals +0.5 δA and −0.5 δA and supplying the same to third and fourth multipliers 7 and 8, respectively, said third and fourth multipliers 7 and 8 being included in said in-phase and phase quadrature paths I and Q, therewith pre-correcting the in-phase and phase quadrature signals of the first quadrature signal path S1 with −δA to pre-compensate for the amplitude error δA occurring in the first filter circuit PF1.

The amplitude and phase control signals Ac and Pc not only vary with the quadrature amplitude and phase imbalance of the quadrature signal of the first quadrature signal path S1, but also with the amplitude variations of this quadrature signal due to the linear signal processing in both first and second quadrature signal paths S1 (i.e. in the first filter circuit PF1) and S2. Dependent on spread, current settings, bias voltage, etcetera, an ideal situation can be obtained, in which the amplitude and phase control signals Ac and Pc will fully compensate all cumulated amplitude and phase errors of all circuitry preceding and inclusive the error correction circuit ECC and pre-compensate all amplitude and phase errors of the first filter circuit PF1, such that the quadrature signal at the quadrature output Oi, Oq is free from any amplitude and phase error. In this event, the compensation is effective for all amplitude values of the wanted quadrature signal W and the mirror signal M as shown in FIGS. 1A and 1B. This allows to implement said first filter circuit PF1 with active polyphase filters, e.g. active polyphase filters using resonance amplifiers, such as known from the above cited U.S. Pat. No. 5,220,686, without mirror signals driving the transconductance amplifiers used therein, beyond their range of linear operation.

In a non-ideal situation, the amplitude and phase control signals Ac and Pc may comprise small residual errors, which can be reduced by an automatic gain control using the variations of the amplitude and phase control signals Ac and Pc caused by the amplitude variations of the wanted quadrature signal W and the mirror signal M to stabilise these amplitude and phase control signals Ac and Pc.

In the embodiment of the mirror suppression circuit of FIG. 2, the second quadrature signal path S2 is coupled to the first quadrature signal path S1 subsequent to the error correction circuit ECC. The invention may well be applied by coupling the second quadrature signal path S2 to the first quadrature signal path S1 prior to the error correction circuit ECC (not shown).

FIG. 3 shows an embodiment of a receiver comprising a mirror suppression circuit according to the invention and providing quadrature signal processing comprising an RF front end FE coupled to antenna means ANT such as known from the cited published patent application WO 01/58029 and comprising (not shown) an RF input stage coupled to the antenna means ANT and followed by a mixer stage for a conversion of an RF signal into an IF signal using a tuning oscillator having a tuning frequency $f_{TO}$. With an RF frequency disposition of a wanted RF signal s around a wanted RF carrier $f_W$ and a strong mirror signal at $f_M$, as depicted in the diagram of FIG. 1A, the RF front end FE provides a quadrature IF signal having a frequency disposition as depicted in the diagram of FIG. 1B.

This IF quadrature signal is being supplied to first quadrature signal path S1, which includes error correction circuit ECC followed by a quadrature IF filter stage IFW functioning as first filter circuit and having a resonance frequency at the carrier frequency of said quadrature IF signal, i.e. $f_{IF}$. The selected quadrature IF signal is being supplied to a demodulation circuit DEM to demodulate the same into the baseband modulation signal, e.g. an stereophonic audio signal, which is further processed in an audio signal processor ASP and reproduced with stereo left and right loudspeakers L and R. The demodulation circuit DEM may be an FM, PM or AM demodulator, dependent on the RF signal modulation type.

According to the invention the first quadrature signal path S1 is being coupled on the one hand from the quadrature output of the IF filter stage IFW to a first quadrature input Idi1, Idq1 of an error detection circuit EDC. On the other hand, the first quadrature signal path S1 is coupled prior to said quadrature IF filter stage IFW through second quadrature signal path S2 to second quadrature input Idi2, Idq2 of said error detection circuit EDC. In the embodiment shown in this FIG. 3, the second quadrature signal path S2 includes a cascade connection of an inverter INV and a filter circuit IFM, which preferably is identical to the IF filter stage IFW, said cascade connection being coupled between the quadrature output of the error correction circuit ECC and the second quadrature input Idi2, Idq2 of said error detection circuit EDC. The inverter INV and the filter circuit IFM operate together as second filter circuit having a resonance frequency at the negative IF frequency, therewith selecting mirror signals such as mirror signal M in FIG. 1B.

As clarified above with respect to the mirror suppression circuit of FIG. 2, both amplitude and phase errors of the quadrature signal at the output of the error detection circuit EDC and IF signal amplitude variations due to variations in RF field strength, are negatively fed back to the error correction circuit ECC and therewith suppressed. This prevents strong mirror reception from deteriorating the receiver performance and allows to use active circuitry, such as resonance amplifier type polyphase filters, in the IF filter stage IFW without introducing non-linearities.

The invention is not limited to the embodiments explicitly disclosed. It may well be possible without leaving the scope and spirit of the invention, to dispense with the differential stages 1 and 6 e.g. by correcting for both phase and amplitude mismatch in either the in-phase path I only, or in the phase quadrature path Q only, or to carry out such corrective measure on in-phase and phase quadrature IF oscillator signals VCOI and VCOQ of the local IF tuning oscillator included in the RF front end FE and preceding the first quadrature signal path S1.

Furthermore, the second filter circuit in the receiver of FIG. 3 may well be omitted or may be implemented with a selectivity deviating from the IF filter stage IFW.

The invention is embodied in each new characteristic and each combination of characteristics. Any reference signs do not limit the scope of the claims. The word "comprising"

does not exclude the presence of other elements than those listed in a claim. Use of the word "a" or "an" preceding an element does not exclude the presence of a plurality of such elements.

The invention claimed is:

1. Mirror suppression circuit comprising
a first quadrature signal path coupled between quadrature signal input and output terminals and including
an error correction circuit for correction of amplitude and phase errors in a carrier modulated quadrature signal comprising a pair of in-phase and phase quadrature signal components,
wherein
a quadrature output of the error correction circuit is coupled through a first filter circuit for a selection of the quadrature signal to a first quadrature input of an error detection circuit,
the first quadrature signal path is coupled prior to the first filter circuit through a second quadrature signal path to a second quadrature input of the error detection circuit,
the error detection circuit detects amplitude and phase errors and provides amplitude and phase control signals to amplitude and phase control inputs of the error correction circuit for a negative feed back of the amplitude and phase errors to the error correction circuit,
the amplitude control signal varies with at least one of products $I_w*I_{ref}$ and $Q_w*Q_{ref}$, and
the phase control signal varies with at least one of products $I_w*Q_{ref}$ and $Q_w*I_{ref}$,
$I_w$ and $Q_w$ representing the in-phase and phase quadrature signal components of the quadrature signal at the first quadrature input of the error detection circuit, and
$I_{ref}$ and $Q_{ref}$ representing the in-phase and phase quadrature signal components of a quadrature reference signal occurring at the negative carrier frequency of the quadrature signal at the second quadrature input of the error detection circuit.

2. Mirror suppression circuit according to claim 1, wherein
the amplitude control signal varies with $I_w*I_{ref}+Q_wQ_{ref}$, and
the phase control signal varies with $I_w*Q_{ref}-Q_w*I_{ref}$.

3. Mirror suppression circuit according to claim 1, wherein
the second quadrature signal path includes
an inverter that provides signal inversion in obtaining the quadrature reference signal.

4. Mirror suppression circuit according to claim 1, wherein
the second quadrature signal path is coupled to the first quadrature signal path subsequent to the error correction circuit.

5. Mirror suppression circuit according to claim 1, wherein
the second quadrature signal path includes a second filter circuit for a selection of the quadrature reference signal.

6. Mirror suppression circuit according to claim 3, wherein
the second quadrature signal path includes the inverter coupled between the first quadrature signal path and the second filter circuit,
the second filter circuit being substantially identical to the first filter circuit.

7. Receiver providing quadrature signal processing comprising an RF input stage subsequently followed by a mixer stage for a conversion of an RF signal into an IF signal,
an IF stage for a selective amplification of the IF signal, and
a mirror suppression circuit comprising
a first quadrature signal path coupled between quadrature signal input and output terminals and including
an error correction circuit for correction of amplitude and phase errors in a carrier modulated quadrature signal comprising a pair of in-phase and phase quadrature signal components,
wherein
a quadrature output of the error correction circuit is coupled through a first filter circuit for a selection of the quadrature signal to a first quadrature input of an error detection circuit,
the first quadrature signal path is coupled prior to the first filter circuit through a second quadrature signal path to a second quadrature input of the error detection circuit,
the error detection circuit detects amplitude and phase errors and provides amplitude and phase control signals to amplitude and phase control inputs of the error correction circuit for a negative feed back of the amplitude and phase errors to the error correction circuit,
the amplitude control signal varies with at least one of products $I_w*I_{ref}$ and $Q_w*Q_{ref}$,
the phase control signal varies with at least one of products $I_w*Q_{ref}$ and $Q_w*I_{ref}$,
$I_w$ and $Q_w$ representing the in-phase and phase quadrature signal components of the quadrature signal at the first quadrature input of the error detection circuit, and
$I_{ref}$ and $Q_{ref}$ representing the in-phase and phase quadrature signal components of a quadrature reference signal occurring at the negative carrier frequency of the quadrature signal at the second quadrature input of the error detection circuit,
the quadrature signal input of the mirror suppression circuit is coupled to a quadrature output of the mixer stage, and
the first filter circuit is part of the IF stage and has a resonance frequency at the carrier frequency of the IF signal.

8. Receiver according to claim 7, wherein
the second quadrature signal path includes a second filter circuit for a selection of the quadrature reference signal, and
the second filter circuit selects the quadrature reference signal occurring at the negative carrier frequency of the quadrature IF signal.

9. Receiver according to claim 8 wherein
the second quadrature signal path includes
an inverter that provides signal inversion in obtaining the quadrature reference signal, and
the second quadrature signal path comprises
the inverter coupled between the first quadrature signal path and the second filter circuit,
the second filter circuit being identical to the IF filter circuit.

10. Receiver according to claim 9, wherein
both first and second filter circuits comprise resonance amplifier type polyphase filters.

11. Receiver according to claim 7, wherein
the error correction circuit includes
an amplitude correction circuit comprising a first multiplier included in at least one of the pair of in-phase and quadrature paths of the first quadrature signal path for an amplitude variation of the signal at the input with the amplitude error.

12. Receiver according to claim 11, wherein
the amplitude correction circuit comprises
  a differential stage following the detection circuit that converts the amplitude control signal into a differential pair of first and second amplitude control signals and supplies the differential pair to the first and a second multiplier, respectively,
the first and second multipliers are included in the in-phase and quadrature paths of the first quadrature signal path.

13. Receiver according to claim 7, wherein
the error correction circuit includes a phase correction circuit comprising
  a third multiplier having
    a signal input coupled to one of the in-phase and quadrature paths of the first quadrature signal path and
    a signal output coupled to a first adder device, which is included in the other of the in-phase and quadrature paths for supplying thereto a part of the signal occurring at the one path to the other path varying with the phase control signal.

14. Receiver according to claim 13, wherein
the phase correction circuit comprises
  a differential stage following the detection circuit that converts the phase error into a differential pair of first and second phase error signals and supplies the differential pair to modulation signal inputs of the third and a fourth multiplier, respectively, and
the third and fourth multipliers include:
  inputs coupled to the phase quadrature and in-phase paths of the first quadrature signal path, and
  outputs coupled to the first and a second adder device, which are included in the in-phase and phase quadrature paths, respectively.

15. Mirror suppression circuit according to claim 2, wherein
the second quadrature signal path includes
  an inverter that provides signal inversion in obtaining the quadrature reference signal.

16. Mirror suppression circuit according to claim 15, wherein
the second quadrature signal path is coupled to the first quadrature signal path subsequent to the error correction circuit.

17. Mirror suppression circuit according to claim 16, wherein
the second quadrature signal path includes a second filter circuit for a selection of the quadrature reference signal.

18. Mirror suppression circuit according to claim 17, wherein
the second quadrature signal path includes the inverter coupled between the first quadrature signal path and the second filter circuit,
the second filter circuit being substantially identical to the first filter circuit.

19. Mirror suppression circuit according to claim 2, wherein
the second quadrature signal path is coupled to the first quadrature signal path subsequent to the error correction circuit.

20. Mirror suppression circuit according to claim 3, wherein
the second quadrature signal path is coupled to the first quadrature signal path subsequent to the error correction circuit.

* * * * *